(12) United States Patent
Hergenrother et al.

(10) Patent No.: US 6,653,181 B2
(45) Date of Patent: Nov. 25, 2003

(54) CMOS INTEGRATED CIRCUIT HAVING VERTICAL TRANSISTORS AND A PROCESS FOR FABRICATING SAME

(75) Inventors: John Michael Hergenrother, Short Hills, NJ (US); Donald Paul Monroe, Berkeley Heights, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/211,674

(22) Filed: Aug. 2, 2002

(65) Prior Publication Data

US 2003/0057477 A1 Mar. 27, 2003

Related U.S. Application Data

(62) Division of application No. 09/335,646, filed on Jun. 18, 1999.

(51) Int. Cl.[7] .......................................... H01L 21/8238
(52) U.S. Cl. ...................... 438/206; 438/207; 438/209; 438/212
(58) Field of Search ................................ 438/207, 209, 438/212, 208, 206; 257/369, 379

(56) References Cited

U.S. PATENT DOCUMENTS

| 5,578,850 A | 11/1996 | Fitch et al. ................. 257/329 |
| 5,733,811 A | 3/1998 | Yamazaki .................... 438/275 |

(List continued on next page.)

OTHER PUBLICATIONS

IEEE Transaction on Electron Devices, vol. 38, No. 3, "Impact of Surrounding Gate Transistor (SGT) for Ultra–High–Density LSI's", H. Takato et al., pp. 573–577 (Mar. 1991).

IEEE Transactions on Electron Devices, Bol. 52, No. 12, "Impact of Vertical Φ–Shape Transistor (V Φ T) Cell for 1 Gbit DRAM and Beyond", S. Maeda et al., pp. 2117–2123 (Dec. 1995).

(List continued on next page.)

*Primary Examiner*—Wael Fahmy
*Assistant Examiner*—Nathan W. Ha
(74) *Attorney, Agent, or Firm*—Richard J. Botos

(57) ABSTRACT

A process for fabricating a CMOS integrated circuit with vertical MOSFET devices is disclosed. In the process, at least three layers of material are formed sequentially on a semiconductor substrate. The three layers are arranged such that the second layer is interposed between the first and third layers. The second layer is sacrificial, that is, the layer is completely removed during subsequent processing. The thickness of the second layer defines the physical gate length of the vertical MOSFET devices. After the at least three layers of material are formed on the substrate, the resulting structure is selectively doped to form an n-type region and a p-type region in the structure. Windows or trenches are formed in the layers in both the n-type region and the p-type region. The windows terminate at the surface of the silicon substrate in which one of either a source or drain region is formed. The windows or trenches are then filled with a semiconductor material. This semiconductor plug becomes the vertical channel of the transistor. Therefore the crystalline semiconductor plug is doped to form a source extension, a drain extension, and a channel region in the plug. Subsequent processing forms the other of a source or drain on top of the vertical channel and removes the sacrificial second material layer. The removal of the sacrificial second layer exposes a portion of the doped semiconductor plug. The device gate dielectric is then formed on the exposed portion of the doped semiconductor plug. The gate electrode is then deposited. The physical gate length of the resulting device corresponds to the deposited thickness of the second material layer.

34 Claims, 11 Drawing Sheets

U.S. PATENT DOCUMENTS

| | | | | |
|---|---|---|---|---|
| 5,891,770 | A | * | 4/1999 | Lee ............................ 438/221 |
| 5,994,735 | A | | 11/1999 | Maeda et al. ................ 257/329 |
| 6,091,115 | A | | 7/2000 | Ohtani et al. ................ 257/369 |
| 6,300,184 | B1 | * | 10/2001 | Choi et al. ................... 438/233 |
| 2003/0060015 | A1 | * | 3/2003 | Layman et al. ............. 438/275 |

OTHER PUBLICATIONS

Solid State Technology, "Nano–MOSFETs for Future ULSI Application", A. Strass, pp. 65–74 (Jan. 1996).

IEDM, "Sub–50 NM Gate Length N–Mosfets With 10 NM Phosphorous Source and Drain Junctions", M. Ono et al., pp. 6.2.1–6.2.4 (1993).

IEDM, "An SPDD P–MOSFET Structure Suitable for 0.1 and Sub 0.1 Micron Channel Length and Its Electrical Characteristics", M. Saito et al., pp. 35.5.1–35.5.4 (1992).

$54^{TH}$ Device Research Conference, "Vertical Fully–Depleted Surrounding Gate Mosfets on sub–0.1 $\mu$m Thick Silicon Pillars", C. Auth et al., pp. 108–109 (Jun. 24–26, 1996).

Appl. Phys. Lett. 64 (11)m "Self–Limiting Oxidation for Fabricating Sub–5 nm Silicon Nanowires", H.I. Liu et al., pp. 1383–1385.

IEEE, "Generalized Guide for MOSFET Miniaturization", J.R. Brews et al., pp. 215–218 (1979).

* cited by examiner

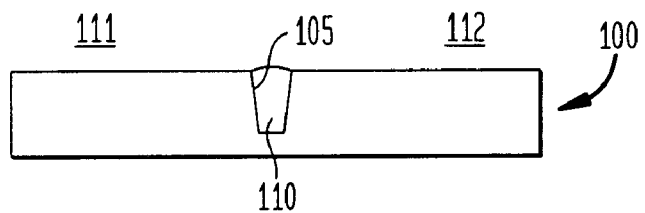
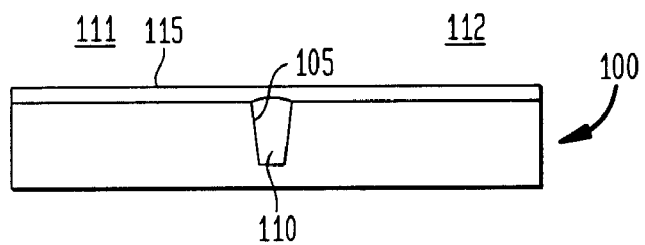
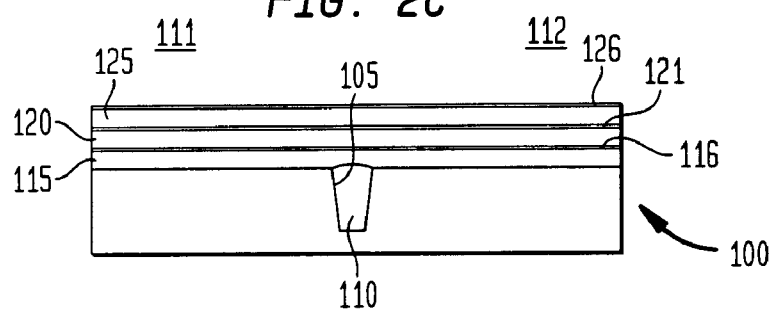
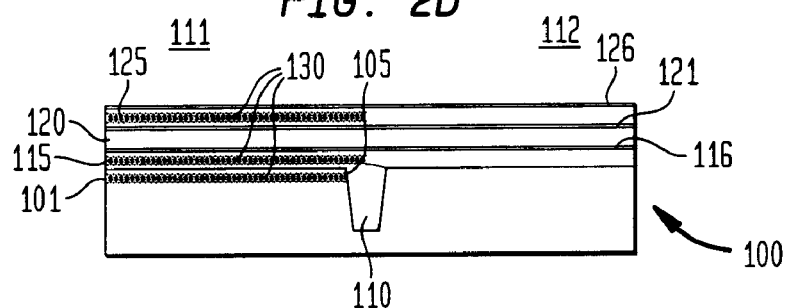
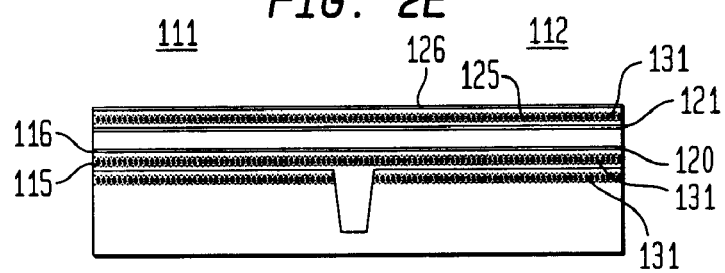

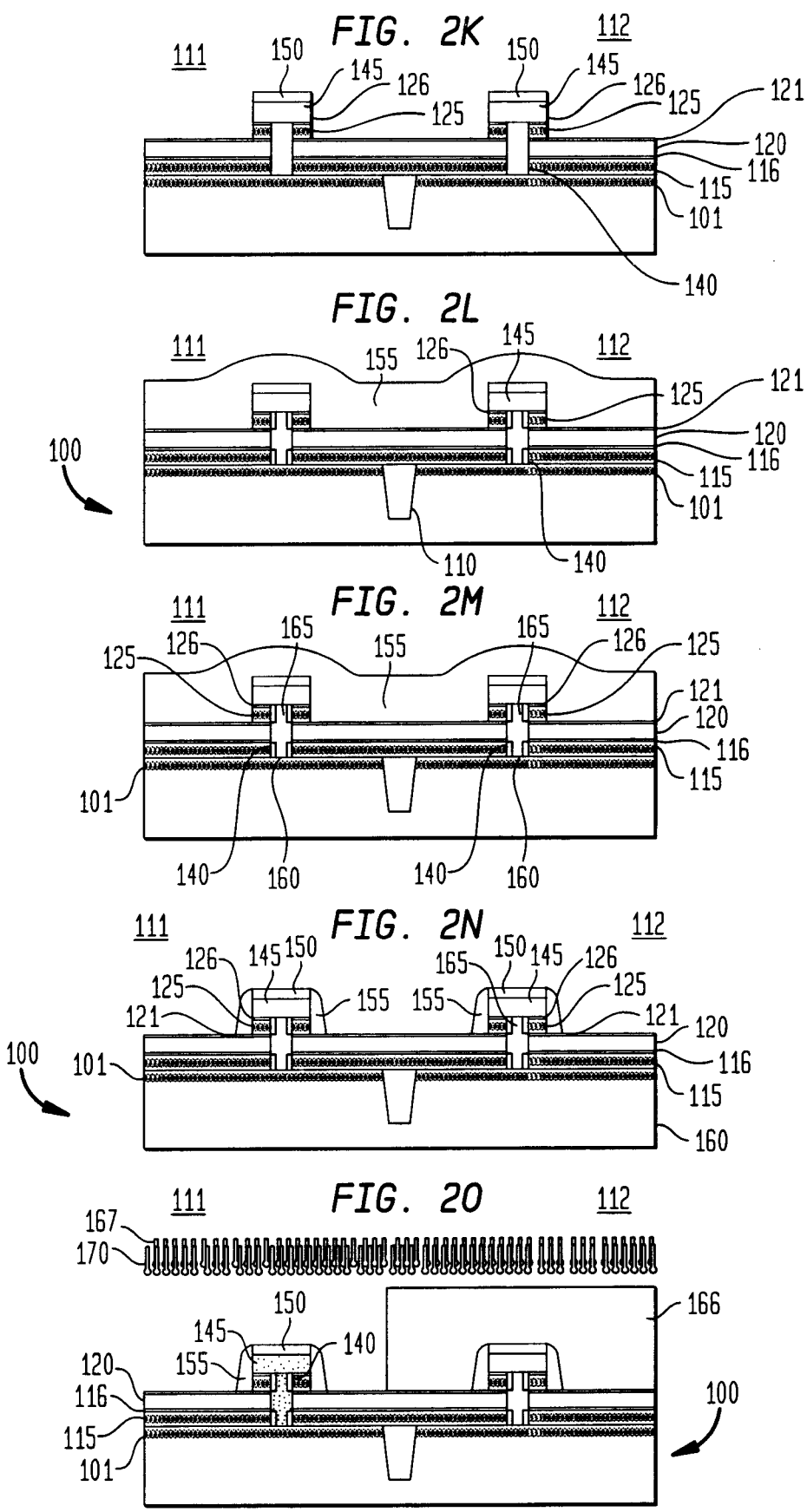

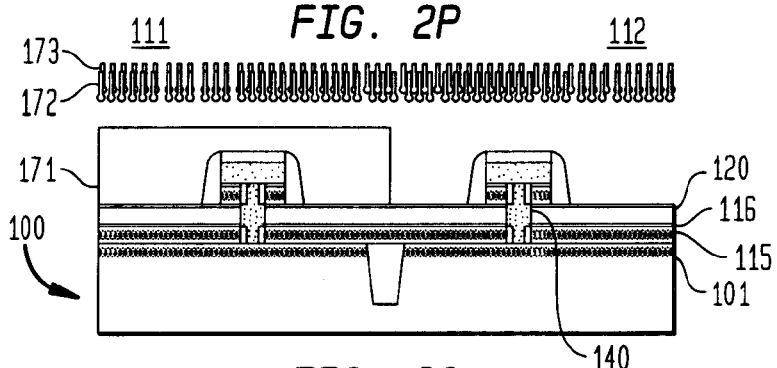
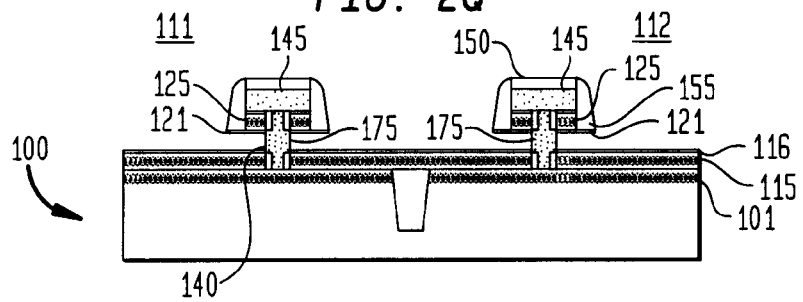
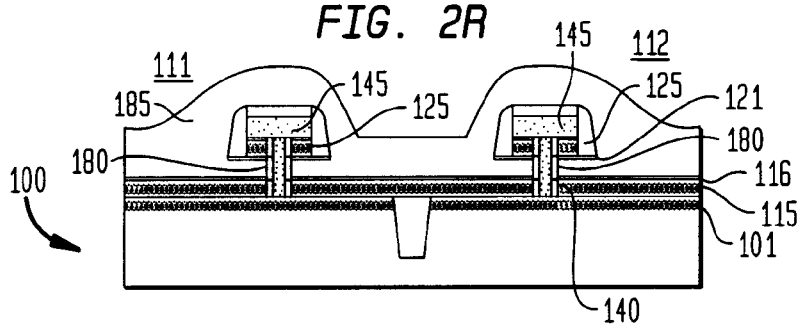
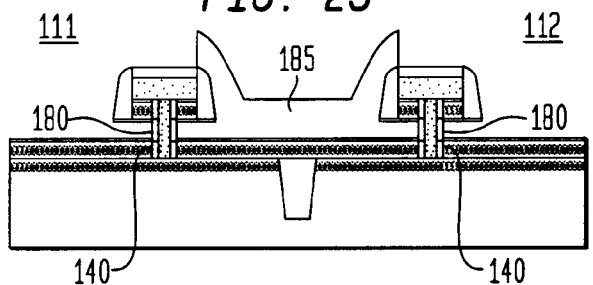
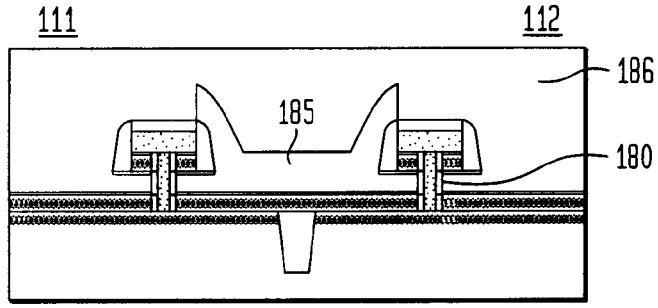

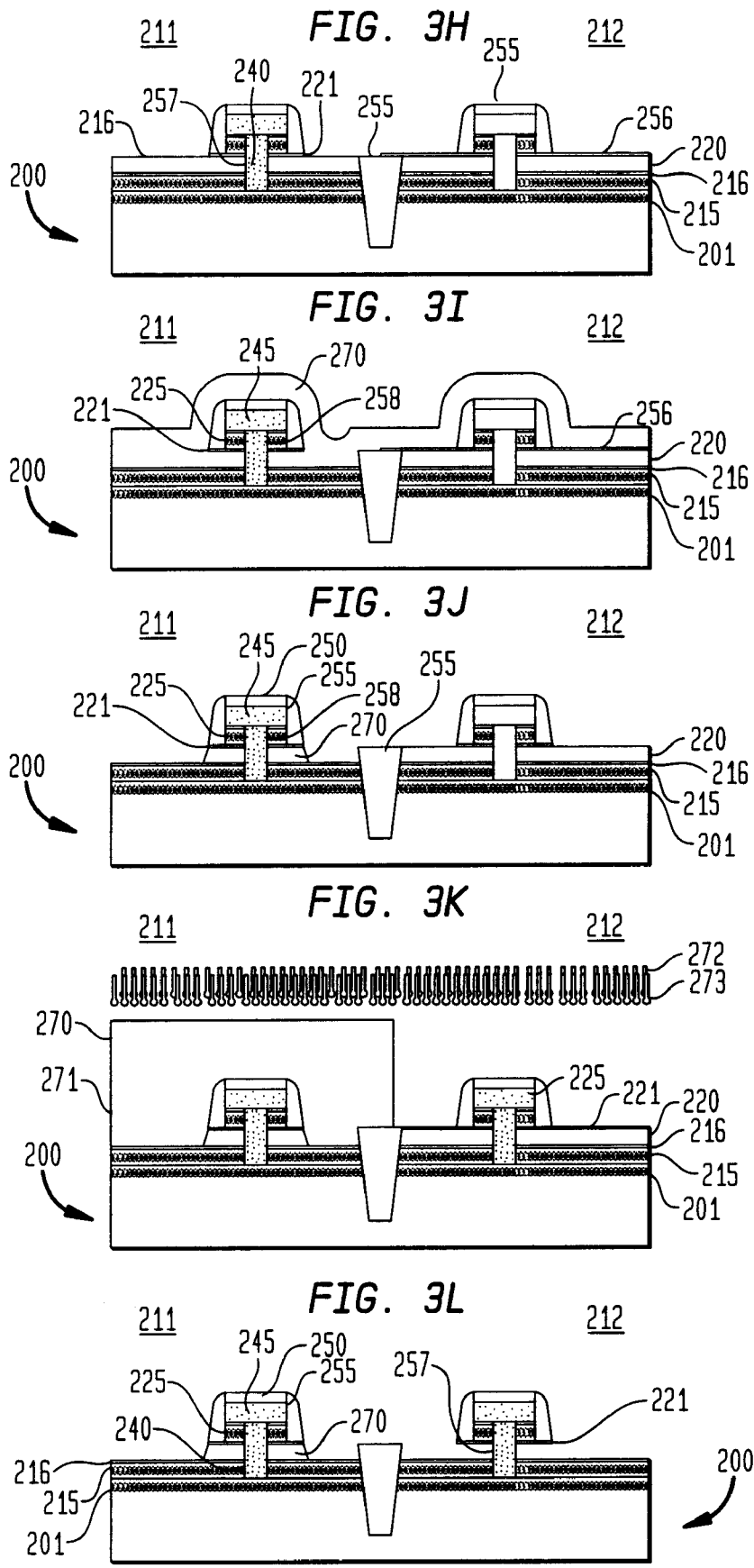

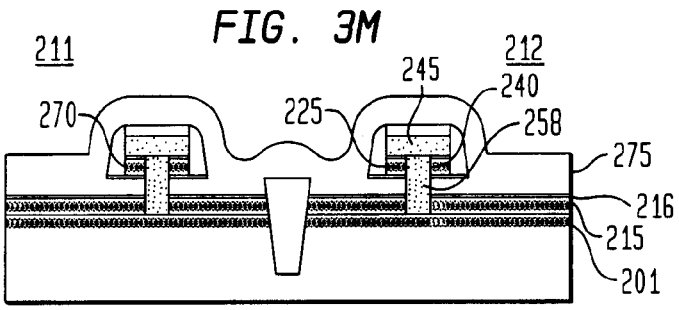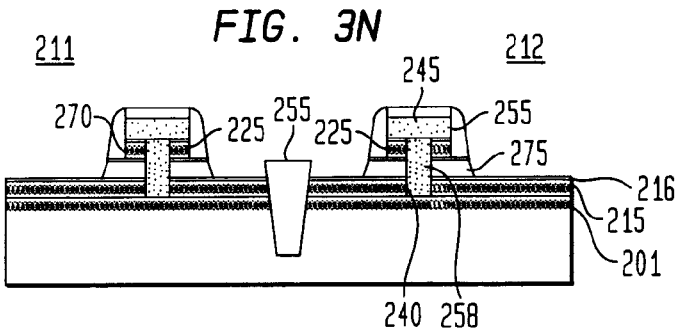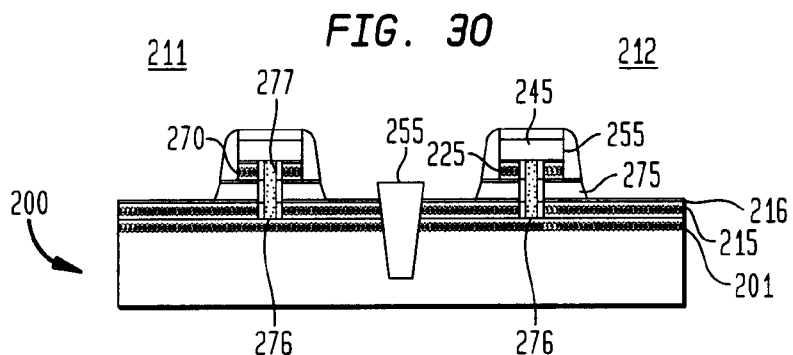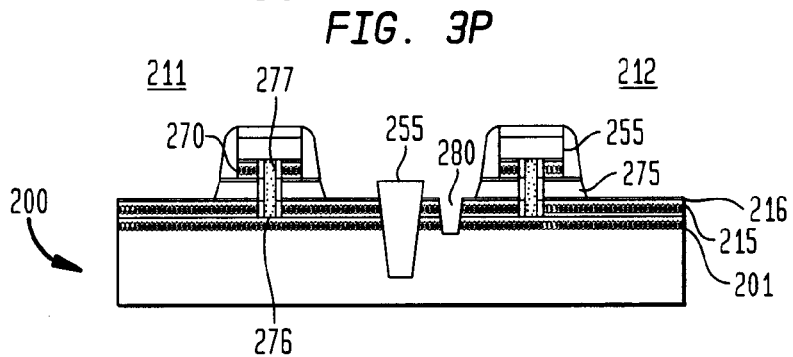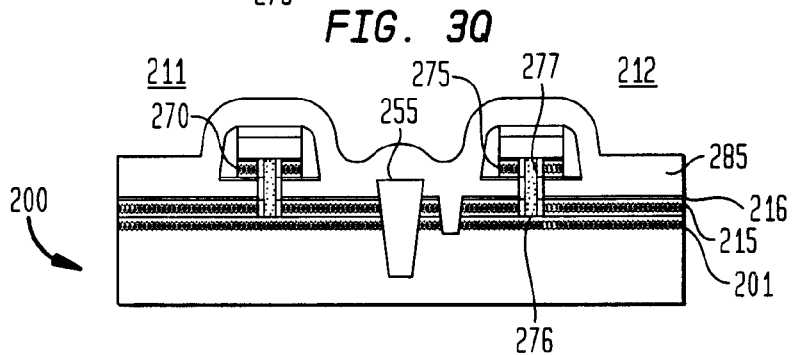

CMOS INTEGRATED CIRCUIT HAVING VERTICAL TRANSISTORS AND A PROCESS FOR FABRICATING SAME

This is a divisional of application Ser. No. 09/335,646 filed on Jun. 18, 1999.

BACKGROUND OF THE INVENTION

1. Technical Field

The present invention is directed to a process for fabricating integrated vertical transistors.

2. Art Background

In integrated circuits, there is a trend toward a higher device density to increase the number of devices per unit area. Device density is increased by making individual devices smaller and placing the devices closer together. Device dimensions (termed feature size or design rules) are decreasing from 0.25 μm to 0.18 μm and beyond. It is also desired to decrease the distance between devices in a commensurate fashion.

Currently, most MOS (metal oxide semiconductor) transistors have a planar configuration. In a planar MOS device, the direction of the current flow is parallel to the plane of the substrate surface. Although there is a need to decrease the size of these devices to achieve increased device density, fabricating these small devices becomes increasingly difficult. In particular, lithography becomes extremely difficult as device dimensions decrease to less than the wavelength of the radiation used to delineate an image of a pattern in a radiation-sensitive material.

A vertical device configuration, described in Takato, H., et al., "Impact of Surrounding Gate Transistor (SGT) for Ultra-High-Density LSI's" *IEEE Transactions on Electron Devices*, Vol. 38 (3), pp. 573–577 (1991) has been proposed as an alternative to the more space-consuming planar device configuration. A schematic of the device is illustrated in FIG. 1. The device 10 has a source 15, drain 20, and channel 25. The length of the channel 25 is perpendicular to the surface of the substrate 30 on which the device 10 is formed. The device is called a vertical transistor because the length of the channel is perpendicular to the substrate surface. A gate 35 surrounds the channel 25.

Although vertical MOSFETs (metal oxide semiconductor field effect transistors) can be packed more densely than planar MOSFETs, the processing issues for the vertical transistors are not trivial. The problems associated with vertical transistor fabrication are exacerbated for complementary MOS technologies (CMOS) in which both n-type and p-type devices are fabricated on a single substrate. A process that makes it easier and more efficient to fabricate vertical MOSFETs for CMOS applications is therefore desired.

SUMMARY OF THE INVENTION

The present invention is directed to a process for fabricating integrated n-MOS and p-MOS vertical transistors for CMOS applications. In the process, n-MOS and p-MOS devices are formed on a semiconductor substrate. The semiconductor substrate is any suitable crystalline semiconductor substrate or silicon on insulator substrate. The substrate is either an unprocessed (bare) wafer or a substrate which has already had one or more device layers formed thereon or has otherwise been previously processed.

In the process, the device active regions (i.e. the source extension, the drain extension, and channel) are defined by depositing at least three layers of material on the substrate. The first and third of these layers are used to define one of either a source or drain extension in a plug of semiconductor material subsequently formed in the three layers of material. Whether the first layer is used to form a source or drain extensions depends on whether the device source or the device drain is formed under the semiconductor plug. That is, if the device source is formed under the semiconductor plug, then the first layer is used to define the source extension and the third layer is used to define the drain extension. If the device drain is formed beneath the semiconductor plug, then the first layer is used to define the drain extension and the third layer is used to define the source extension.

The n-MOS and p-MOS devices are formed by defining two regions in the substrate. Substrate, as used herein, is the semiconductor substrate at the relevant point in the process sequence (i.e. including the materials formed on the semiconductor substrate). The first region is the region in which the n-MOS devices are subsequently formed. The first region is therefore selectively implanted with an n-type dopant (e.g. arsenic or phosphorus). At least two implants are required to dope both the first and third layers as well as the source or drain. The second region is the region in which the p-MOS devices are formed. The second region is therefore selectively implanted with a p-type dopant (e.g. boron). Again, at least two implants are needed to dope both the first and third layers as well as the device source or drain.

The depth of the implant peak and dose of these implants is selected to provide a certain threshold concentration (e.g. greater than $1 \times 10^{19}/cm^3$ for the source and drain and greater than $1 \times 10^{20}/cm^3$ for the dopant sources for the source and drain extensions). For convenience, the source (drain) is distinguished from the source (drain) extension by referring to it as the deep source (drain). The depth of the first implant peak is near the surface of the underlying semiconductor substrate. Dopant at this depth is used to define one of either the deep source or deep drain of the device. The second depth is the first layer of material formed on the semiconductor substrate. Dopant in this layer is used to form the applicable source/drain extension. The third depth is the third layer formed on the semiconductor substrate. Dopant in this layer is used to form the other source/drain extension. The dopants are implanted instead of introduced in-situ because different dopants are required depending upon whether the device being formed is n-MOS or p-MOS. In an alternate embodiment, the first and third layers are selectively implanted immediately after each layer is respectively formed on the substrate.

The n-type region is electrically isolated from the p-type regions by forming a trench in the semiconductor substrate. The trench is then filled with a dielectric material. The point in the process sequence when this electrical isolation is performed is largely a matter of design choice.

After the n-MOS and p-MOS regions are formed, windows are formed in the at least three layers of material formed on the substrate. The windows terminate at or slightly below the surface of the underlying semiconductor substrate. The windows are then filled with a semiconductor material.

The source/drain extensions and the channel of the device are formed in this plug of semiconductor material. If the plug is formed in the n-type region, the device formed in that region will be an n-MOS device. If the plug is formed in the p-type region, the resulting device will be a p-MOS device. The device regions are formed using a combination of selective implants and the introduction of dopants from the adjacent doped layers of material. The device has self-aligned source and drain extensions in that the thicknesses of the first and third layers of doped material define the source and drain extensions in the semiconductor plug and the second layer holds the place for the subsequently formed gate. The thickness of the second layer of material defines the gate length of the device.

Thin (i.e. about 50 nm or less) layers of material are formed between the first, second, and third layers. The material for these layers is selected to have a higher degree of resistance to the etch expedients selected to remove some or all of the three material layers. These expedients are referred to as etchants. These thin layers are referred to as etch stop layers. These thin layers are also used to define the relative spacing of the device gate and the source and drain extensions.

The second layer of material is sacrificial (i.e. no portion of it is present in the formed device). When the second layer is removed, a portion of the surface of the adjacent semiconductor plug is exposed. A gate dielectric material is then formed on the exposed portion of the semiconductor plug using conventional expedients.

The gate is then formed on the substrate. In the embodiment of the present invention wherein the gate material for the n-type devices is the same as the gate material for the p-type devices, the gate material is simply deposited and patterned.

In the embodiment of the present invention wherein the gate material for the n-type devices is different than the gate material for the p-type devices, the second layer of material is removed selectively from either the n-type or p-type region. For example, the second layer of material for the n-type devices is removed while the p-type region is masked. While the p-type devices are masked, the n-type region is implanted with dopants as desired, after which the second layer in the n-type region is removed. The gate dielectric is then formed on the exposed portion of the semiconductor plug in the n-type region, after which a conductive layer of a first gate material is formed on the entire substrate (the mask over the p-type device regions having previously been removed). The first gate material (e.g. polycrystalline silicon doped with n-type dopants) is then selectively removed, and the only portion that remains is the portion adjacent to the semiconductor plug of the n-type devices. The selective process of second layer removal, gate dielectric formation and second gate material deposition is then performed for the p-type region.

Electrical interconnects are then formed on the substrate. In this embodiment, the conductive gate material for the p-type devices is electrically connected to the conductive gate material for the n-type devices. This is referred to as a strap connection. This contact is in addition to any desired interconnects formed between the gate electrodes and the substrate regions having devices of either polarity. Consequently, in this embodiment, a conductive material is deposited and patterned to form these two interconnects.

DETAILED DESCRIPTION

The present invention is directed to a process for fabricating vertical transistors for a CMOS technology. CMOS integrated circuits have p-MOS devices integrated with n-MOS devices and are well known to one skilled in the art. The uses and advantages of CMOS integrated circuits are well known to one skilled in the art and are not described herein.

A process for fabricating vertical transistor MOSFETs (either n-MOS or p-MOS) is described in U.S. Ser. No. 09/143,274 entitled, "Process for Fabricating Vertical Transistors," filed on Aug. 28, 1998 which is commonly assigned and is hereby incorporated by reference. In the present process, both n-MOS and p-MOS devices are formed on a single semiconductor substrate. Multiple layers of material are formed on the surface of a semiconductor substrate. The multiple layers have different etch resistances in a selected etch expedient. One of the layers in the multiple layer structure is a sacrificial layer used to define the physical gate length of the device. Specifically, the thickness and placement of the sacrificial layer defines the thickness and placement of the gate of the vertical transistor. The other layers are used to form the source and drain extensions for the devices by solid phase diffusion.

Figure 1:
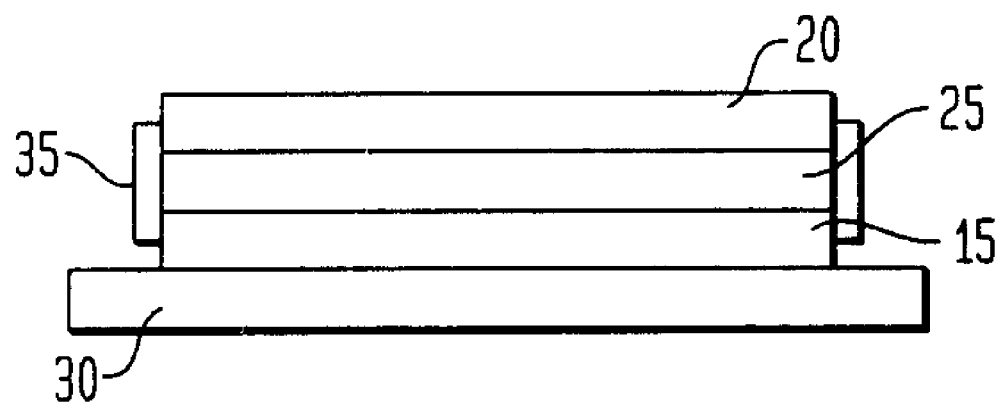
FIG. 1 is a schematic side view of a vertical transistor.
Figure 2F:
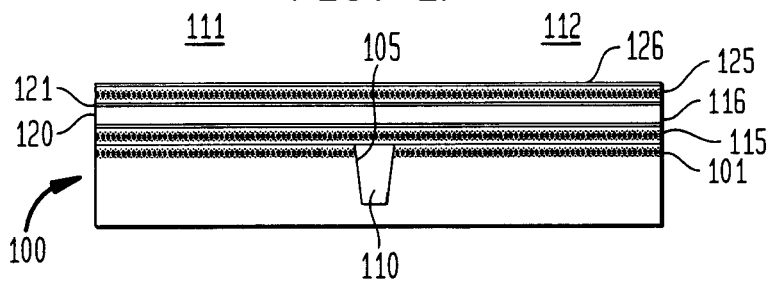
FIGS. 2A–2V illustrates the process sequence of one embodiment of the present invention.

One embodiment of the present invention is described with reference to FIGS. 2A–2V. In the described embodiment, the vertical transistors that result from the described process sequence have a vertically aligned source, channel and drain with the source on the bottom and the drain on the top. This configuration is for illustrative purposes only. One skilled in the art will appreciate that a vertical transistor with the drain on the bottom and the source at the top is readily fabricated from the same description.

Initially, the substrate is subjected to a trench isolation process. Trench isolation is a conventional process in CMOS integrated circuit fabrication and is not described herein. As a result of trench isolation, referring to FIG. 2A, a trench 105 is formed in semiconductor substrate 100. The trench 105 is filled with a dielectric material 110 such as silicon dioxide. The purpose of the trench is to effect electrical isolation between an n-MOS region 111 and a p-MOS region 112 on the substrate 100. Referring to FIG. 2B, a layer of dielectric material 115 is deposited on the substrate 100. An example of a suitable dielectric material is silicon dioxide deposited from a tetraethyl orthosilicate precursor. The deposited layer is then planarized using a suitable planarization expedient such as chemical mechanical polishing or global contact planarization. The selected thickness for layer 115 defines the length of the subsequently formed source extension.

Referring to FIG. 2C, additional layers of material 116, 120, 121, 125 and 126 are formed over the semiconductor substrate. Layer 116 is a thin layer of an electrically insulating material such as silicon nitride. Material layer 116 separates what will become a dopant source layer from the overlying gate electrode (185 in FIG. 2S) of the subsequently formed device. Thus, material layer 116 is made of a material and has a thickness that is consistent with its function as an offset spacer. A thickness in the range of about 5 nm to about 50 nm is contemplated as suitable for material layer 116. Layer 116 is also made of a material that resists etching by etchants suitable for removing the layer of material 120 formed over layer 116. Layer 116 also functions as a diffusion barrier for n and p dopants and it defines the spacing of the source extension dopant layer relative to the eventual gate.

A layer of material 120 is formed over layer 116. It is advantageous if layer 120 is the same material as layer 115 (e.g. silicon oxide). The thickness of the layer 120 is selected to define the physical gate length of the device. This is because this second layer 120 is sacrificial, i.e., it will be removed and the gate of the device will be formed in the space defined by this layer. When the sacrificial layer 120 is removed, the gate oxide (180 in FIG. 2R) is formed on what is to become the channel of the device.

Another thin layer of electrically insulating material 121 is formed over layer 120. From a processing perspective, it is efficient for the material selected for layer 121 to be the same as the material selected for layer 116 (e.g. silicon nitride). However, this is not a requirement. The thickness of layer 121 is comparable but not necessarily equal to the thickness of layer 116. Like layer 116, layer 121 also functions as an offset spacer, an etch stop layer and a diffusion barrier.

Layer 125 is formed over layer 121. Layer 125 is comparable to layer 115 in material and thickness. The thickness of the layer 125 is used to control the length of the drain extension subsequently formed (165 in FIG. 2M). Another thin layer of electrically insulating material 126 is formed over layer 125. It is advantageous for the material selected for layer 126 to be the same as the material selected for layers 116 and 121 (e.g. silicon nitride). Layer 126 functions as a CMP stop layer in subsequent processing. Consequently layer 126 has a thickness that is consistent with this objective (i.e. a thickness of at least about 25 nm). Layer 126 also functions as a diffusion barrier.

Referring to FIG. 2D, n-type dopants 130 are selectively implanted into the portion of layers 125, 115 and the top region 101 of substrate 100 in region 111. One skilled in the art will select the appropriate energy and dose for the target implants for introducing dopant of the desired concentration into these layers. One skilled in the art will not select implant conditions that would significantly degrade the ability of layers 116, 121, and 126 to perform their intended function. The amount of dopants and the conditions used to implant the dopants are largely a matter of design choice and are not discussed in detail herein. A dopant concentration sufficient to render the top region 101 conductive (i.e. a dopant concentration greater than $1\times10^{19}/cm^3$) is suitable for top region 101. Dopant concentrations of greater than $1\times10^{20}/cm^3$ are contemplated as suitable for layers 115 and 125. The selective implant is performed by forming a mask (not shown) over area 112. The mask is formed lithographically using techniques well known to one skilled in the art.

After the selective implants of area 111, the mask is stripped and a new mask (not shown) is formed over region 111. Referring to FIG. 2E, p-type dopants 131 are selectively implanted into layers 125, 115 and the top region 101 of substrate 100 in region 112. Again, one skilled in the art will select the appropriate energy and dose for the target implants for introducing dopant of the desired concentration into these layers.

After the mask (not shown) over region 112 is removed, the substrate is annealed to distribute the dopants in their respective regions (101, 115 and 125) and to ensure that the top region 101 of the substrate 100 has recrystallized. The substrate is annealed at a temperature in excess of 700° C. to accomplish these objectives. The thin layers of dielectric material 116 and 121 serve to prevent the dopants from diffusing into layer 120. The doped region 101 of the substrate 100 is used to form a heavily doped deep source region for the subsequently formed devices. Doped layer 115 is used to form the corresponding source extension. Layer 120 is the sacrificial layer that defines the physical gate length of the device. Layer 125 is used to form the drain extension. For convenience, the embodiment wherein the source region is formed in the semiconductor substrate 100 is the subject of this description.

The depth of the heavily doped source region, the concentration of dopant therein and the type of dopant (i.e. n-type or p-type) are all a matter of design choice. A heavily doped source region 101 has a dopant concentration (n-type dopant in region 111 and p-type dopant in region 112) that is in the range of about $1\times10^{19}$ atoms/cm$^3$ to about $5\times10^{20}$ atoms/cm$^3$. The depth of this region in the substrate is less than about 500 nm.

Figure 2G:
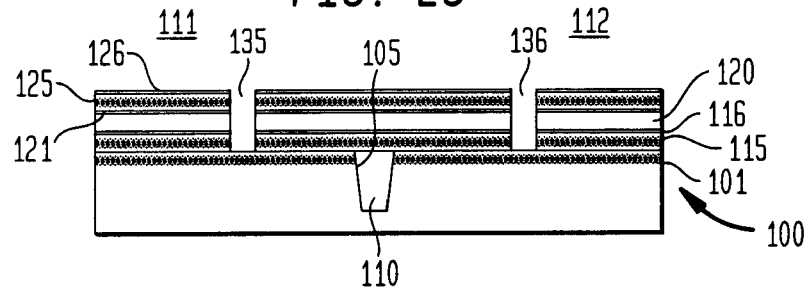

Referring to FIG. 2G, openings 135 and 136 (i.e. a window or trench) (for convenience, window or trench will simply be referred to as a window hereinafter) are then etched through layers 115, 116, 120, 121, 125 and 126 to the heavily-doped surface 101 of the silicon substrate 100. Window 135 is etched into the n-type region and window 136 is etched into the p-type region. The cross-sectional thickness (horizontal dimension in cross-section) of the window is determined by the size constraints for the particular device and the limitations of the lithographic and etching techniques used to form the window. The width of the trench (the width being orthogonal to both the horizontal dimension in cross-section as well as the vertical direction) is largely a matter of design choice. For a given horizontal dimension in cross-section, the current passed through the conductor formed in the opening will increase with increasing trench width. The window is formed using conventional lithographic techniques.

Figure 2H:
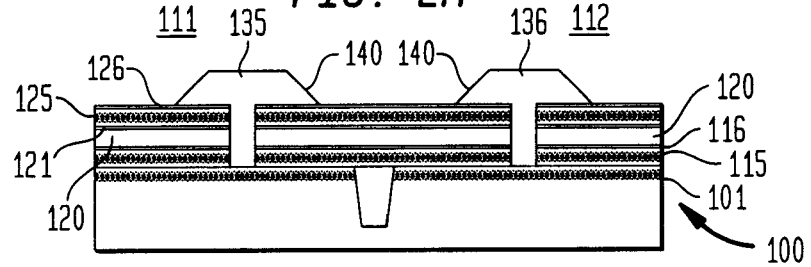

Referring to FIG. 2H, the windows 135 and 136 are then filled with a single crystal semiconductor material such as silicon 140. Other examples of crystalline semiconductor materials include silicon-germanium and silicon-germanium-carbon. Techniques for forming crystalline semiconductor materials in windows are well known to one skilled in the art and includes a judicious choice of the trench (in three dimensions the window is a trench) orientation with respect to the crystallography of the underlying substrate. In one example, the windows 135 and 136 are filled with a crystalline silicon material by epitaxial growth of silicon therein. In this embodiment, the crystalline silicon 140 is formed in and over the windows 135 and 136 in the manner illustrated in FIG. 2H. In another embodiment (not shown), an amorphous layer of the semiconductor material is deposited on the structure depicted in FIG. 2G, after which the portion of the amorphous material deposited over layer 126 is removed by CMP. The amorphous silicon is then recrystallized by an annealing step in a procedure known as solid phase epitaxial regrowth. In yet another embodiment (not shown), amorphous semiconductor material is deposited on the structure depicted in 2G. Using lithography and etching, the layer of amorphous semiconductor material is selectively removed so that on the amorphous material deposited in the windows 135 and 136, and a small plug at the top thereof, remains. The amorphous semiconductor material is then annealed to recrystallize the material by solid phase epitaxial regrowth.

Figure 2I:
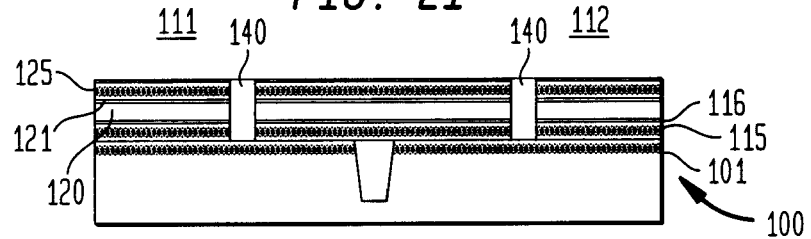
Figure 2J:
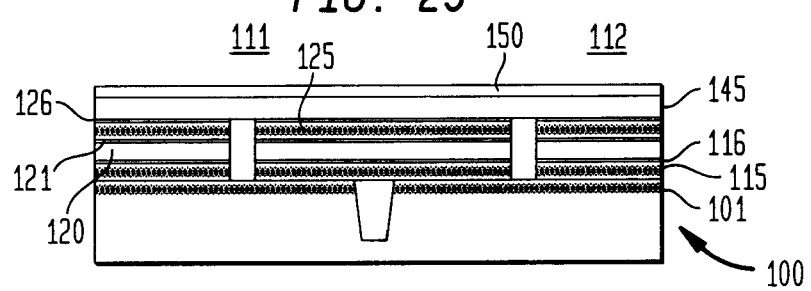

Referring to FIG. 2I, the plug on top of layer 126 is removed using an expedient such as chemical mechanical polishing. Here, layer 126 functions as a polish stop layer. Referring to FIG. 2J, a layer of polycrystalline silicon 145 is formed over the structure depicted in FIG. 2I. Preferably, amorphous silicon is deposited and then recrystallized. This layer, when subsequently patterned and doped, becomes the drain contact of the device (in this embodiment). The thickness of layer 145 is about 50 nm to about 200 nm to be consistent with this objective. Another layer of dielectric material (e.g., silicon nitride) 150 is formed on the layer of polycrystalline silicon 145. The thickness of layer 150 is also about 50 nm to about 200 nm and is selected to electrically isolate the subsequently formed gate electrode from the subsequently formed drain contact of the device.

Another etch mask (not shown) is formed over the structure depicted in FIG. 2J using conventional lithographic techniques. This etch mask is patterned so that the portion of the layers 145 and 150 overlying and adjacent to the silicon plug 140 in regions 111 and 112 are not exposed through the mask. The structure with the etch mask formed thereon is then etched anisotropically using a conventional dry etch expedient. The structure obtained as a result of this etch is illustrated in FIG. 2K. In order to obtain the illustrated structure, etch expedients are selected such that layer 150 is etched selectively with respect to layer 145. Similarly, layer 145 is etched selectively with respect to layer 126. Layers 126 and 125 are then etched selectively with respect to layer 121. As a result of this etch, the portion of layers 150, 145, 126 and 125 that are exposed through the mask are completely removed. The materials and etch expedients needed to obtain the structure depicted in FIG. 2K are readily ascertained by one skilled in the art. The materials and etch expedients are selected to ensure that the etch stops on layer 121.

Referring to FIG. 2L, a layer of a dielectric material 155 is formed over the structure depicted in FIG. 2K. This layer protects layer 125 during the subsequent removal of layer 120. It is advantageous if the dielectric material is silicon nitride. The material selected for layer 155 has an etch rate in the etchant used to remove layer 120 that is much smaller (at least 10 times less) than the etch rate of layer 120 in that etchant.

The structure depicted in FIG. 2L is then subjected to a thermal driving force that is sufficient to cause dopants to diffuse from layers 115 and 125 into the adjacent silicon plug 140. Dopants of one type (i.e. n-type in region 111 or p-type in region 112) are introduced into the silicon plug 140 to form the source and drain extensions, 160 and 165, respectively. The placement of this step in this processing sequence is merely illustrative. As one skilled in the art is aware, the solid phase diffusion step can be performed at a variety of points in the process sequence. The structure with the suitably doped silicon plug is illustrated in FIG. 2M. This self-aligned technique is advantageous because the doped area is defined by the interface between the silicon plug 140 and the layer(s) of material, 115 and 125, used as the dopant source. This technique allows for the formation of self-aligned source/drain extensions (i.e. the source/drain extensions are aligned to the gate). Examples of solid phase diffusion techniques used to form self-aligned source and drain extensions are described in Ono, M., et al., "Sub-50 nm Gate Length N-MOSFETS with 10 nm Phosphorus Source and Drain Junctions," *IEDM*93, pp. 119–122 (1993) and Saito, M., et al., "An SPDD D-MOSFET Structure Suitable for 0.1 and Sub 0.1 Micron Channel Length and Its Electrical Characteristics," *IEDM*92, pp. 897–900 (1992), which are hereby incorporated by reference.

Referring to FIG. 2N, the structure depicted in FIG. 2M is subjected to an anisotropic dry etch. The etch expedient is conventional and suitable etch expedients are well known to one skilled in the art. Portions of the silicon nitride layers 155, 150 and 121 are removed by the anisotropic etch. The etchant is selective in that it removes silicon nitride at a much faster rate than it removes the underlying silicon oxide layer 120. Endpoint is determined by monitoring the plasma for oxygen content, and stopping the etch when the amount of oxygen in the plasma exceeds a certain predetermined amount. All of layer 155 is removed over the remaining portion of layers 121, 125, 126, 145 and 150. Only a spacer-like portion of layer 155 remains on the structure depicted in FIG. 2N.

Referring to FIG. 2O, in the n-type region 111, dopant of the opposite type (i.e., p-type) is implanted into the plug 140. Since this is a selective implant for region 111, region 112 is masked with photolithographically defined mask 166 as dopant 167 is implanted into the silicon plug 140 in region 111. This dopes the channel of the device. The amount and distribution of dopant is a matter of design choice. For example, halo implants as well as the channel implant are contemplated. Polycrystalline silicon layer 145 is also doped by implantation (with n-type dopant 170) to form the device drain. The concentration of dopant in the polycrystalline layer 145 is largely a matter of design choice and typically is in excess of $1 \times 10^{19}/cm^3$. The n-type dopants are also implanted into the surface of sacrificial layer 120.

The resist mask 166 is then removed and another mask 171 is formed over the substrate 100 (FIG. 2P). Region 112 is exposed through the mask 171. Region 112 is subjected to two implants of dopant 172 and 173. In the first implant, n-type dopant 172 is implanted into silicon plug 140 to dope the channel of the device. In the second implant, p-type dopant 173 is implanted into the polycrystalline silicon layer 145 to form the drain of the device. After these implants, the mask 171 is removed from the substrate.

Once the silicon plug 140 is doped and the dopant is distributed in the plug 140 in the desired manner, the substrate is not subjected to conditions that significantly affect the distribution of the dopant in the silicon plug 140. Consequently, after this step, the substrate is not exposed to temperatures that exceed 1100° C. It is advantageous if the substrate is not exposed to temperatures in excess of 1000° C. after this point in the process. In certain embodiments, the substrate is not exposed to temperatures that exceed 900° C. after this point in the process for prolonged periods of time (e.g., in excess of several minutes). However, the substrate can be subjected to a rapid thermal anneal at temperatures of up to about 1050° C. without adversely affecting the distribution of the dopant in the silicon plug 140.

Referring to FIG. 2Q, the substrate is then subjected to a wet etch or isotropic dry etch expedient. The etch rate of layer 120 in this expedient is significantly faster than the etch rate of layers 155, 150, 121 and 116 and polycrystalline silicon plug 140. As illustrated in FIG. 2Q, due to the etch selectivity in the wet etch expedient, the sacrificial layer 120 is completely removed. Layers 116 and 121 confine the etch to the removal of sacrificial layer 120. As a result of this etch, the portion of the silicon plug 140 that corresponds to the deposited thickness of layer 120 is exposed. The exposed surface 175 of the plug 140 will be the physical gate length of the device being formed.

Optionally, the exposed portion of silicon plug 140 is subjected to a surface preparation (e.g. cleaning) technique. For example, the substrate is heated in an oxygen-containing atmosphere to grow a layer of thermal oxide (not shown) on the exposed surface 175 of the crystalline silicon plug 140. The thin layer of thermal oxide is removed using conventional expedients such as a wet etch (e.g., aqueous hydrofluoric acid). As a result of the formation and removal of the sacrificial thermal oxide, the surface of the silicone plug 140 is smoother and some of the sidewall defects and etch damage are removed. The particular conditions used to form and remove the sacrificial oxide are optionally selected to tailor the width of the silicon plug to a desired dimension.

After the optional thin layer of thermal oxide is removed, a layer of gate dielectric (e.g. silicon dioxide, silicon oxynitride, silicon nitride or metal oxide) 180 (FIG. 2R) is formed on the exposed portion 175 of the silicon plug 140. The thickness of the gate dielectric is about 1 nm to about 20 nm. In one embodiment, the silicon dioxide layer is formed by heating the substrate to a temperature in the range of about 700° C. to about 1100° C. in an oxygen-containing atmosphere. Other expedients for forming a conformal gate dielectric layer, such as chemical vapor deposition, jet vapor deposition, and atomic layer deposition, are also contemplated as suitable. Conditions for forming a gate dielectric of the desired thickness are well known to one skilled in the art.

A gate electrode is then formed by depositing a conformal layer 185 (FIG. 2R) of a suitable gate material (e.g. in situ doped amorphous silicon or metal). If the gate material is amorphous silicon is then subsequently recrystallized (i.e. it becomes polycrystalline silicon) using conditions that do not significantly affect the dopant profiles of the dopants in the silicon plug. Other examples of suitable gate materials include silicon-germanium, and silicon-germanium carbon. Metals and metal compounds that have a suitably low resistivity, a suitable work function and are compatible with the gate dielectric material and semiconductor processing are also contemplated as suitable gate materials. Examples of such metals include titanium, titanium nitride, tungsten, tungsten silicide, tantalum, tantalum nitride, molybdenum, aluminum, copper and combinations thereof. Suitable expedients for forming the layer of gate material include chemical vapor deposition, electroplating, and combinations thereof.

Referring to FIG. 2S, the layer 185 is patterned to form the gate 185. The gate configuration is largely a matter of design choice. However, the gate 185 does surround the portion of the silicon plug 140 with the gate oxide 180 formed thereon. The gate 185 contacts both the n-MOS device in region 111 and the p-MOS device in region 112. A thick layer of dielectric material (e.g., silicon dioxide) 186 is formed over the structure depicted in FIG. 2S. As illustrated in FIG. 2T, the layer 186 (FIG. 2T) is then planarized. Conventional planarization expedients such as chemical mechanical polishing are contemplated as suitable.

Figure 2U:
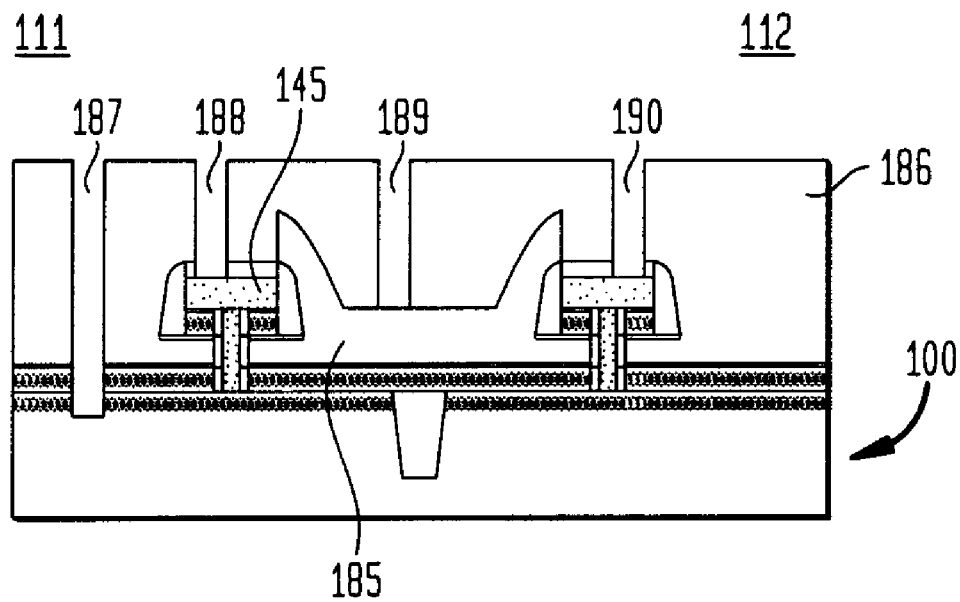
Figure 2V:
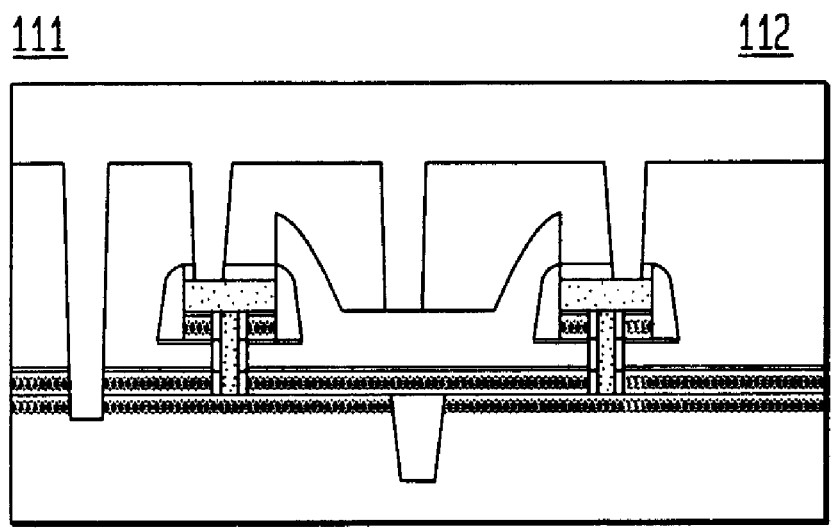

Windows 187, 188, 189 and 190 are formed in layer 186. As depicted in FIG. 2U, window 187 terminates at the doped region 101 of the semiconductor substrate 100. Window 188 terminates at layer 145 of the n-type device (the device drain in this embodiment). Window 189 terminates at the gate electrode 185. Window 190 terminates at layer 145 of the p-type device (the device drain in this embodiment). These windows are then filled with metal using conventional techniques well known to one skilled in the art. The resulting structure is illustrated in FIG. 2V.

Another embodiment of the present invention is described with reference to FIGS. 3A–3R. This embodiment is a "dual-gate material" embodiment of the previous process sequence. Dual gate material means that the gate in the n-MOS region is made of a different material than the gate in the p-MOS region. The reasons why the materials are different and the differences required are well know to one skilled in the art.

Figure 3A:
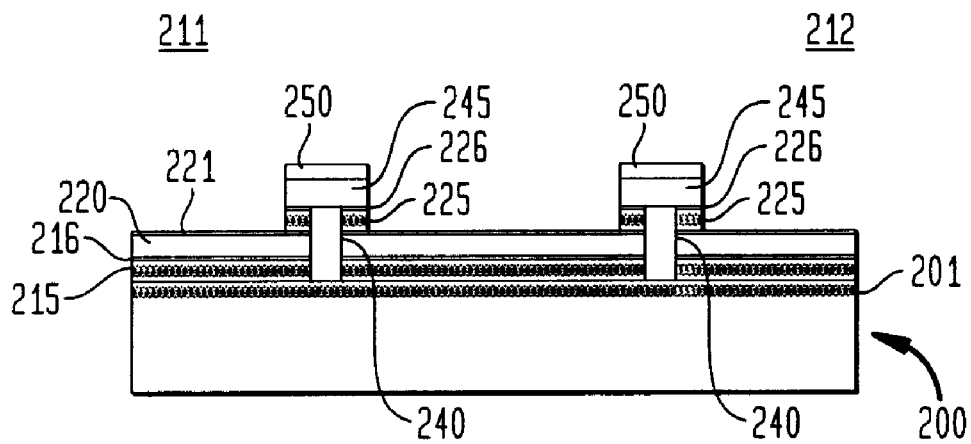
FIGS. 3A–3R illustrates the process sequence of a second embodiment of the present invention.

Referring to FIG. 3A, the structure depicted is formed using a process sequence similar to that depicted in FIGS. 2A–2K. The sequence is similar, but not identical. For example, in this process sequence, the trench isolation is deferred until after a plurality of layers are formed on the semiconductor substrate 200.

Figure 3B:
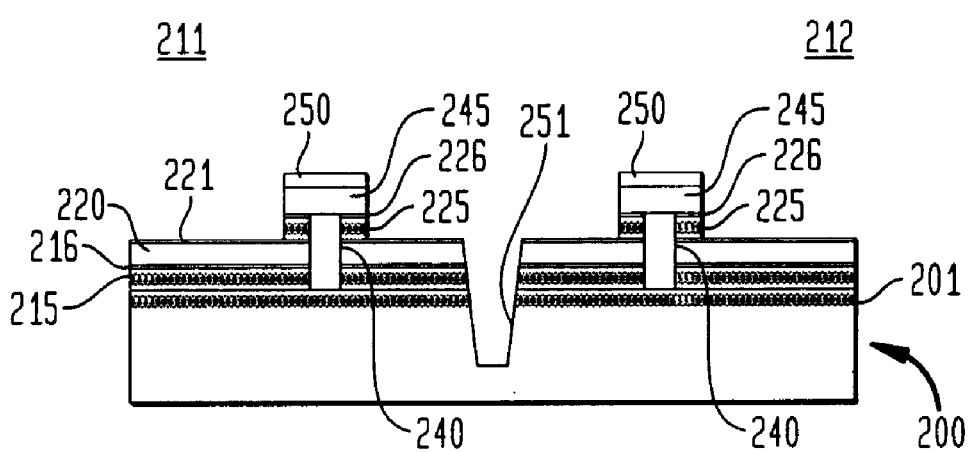
Figure 3C:
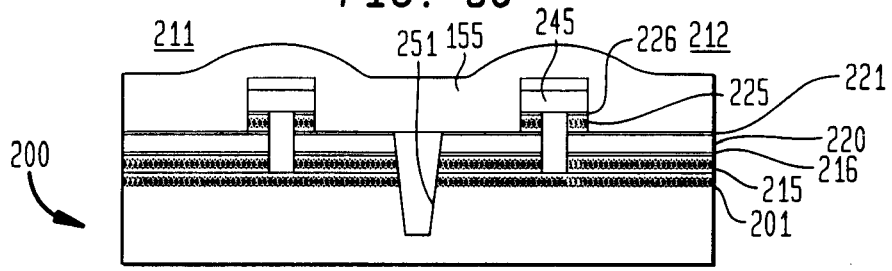
Figure 3D:
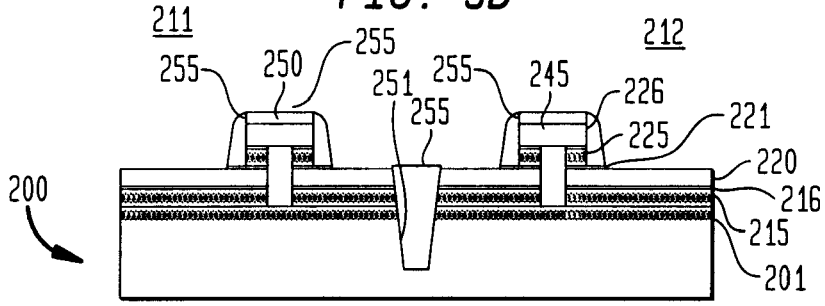
Figure 3E:
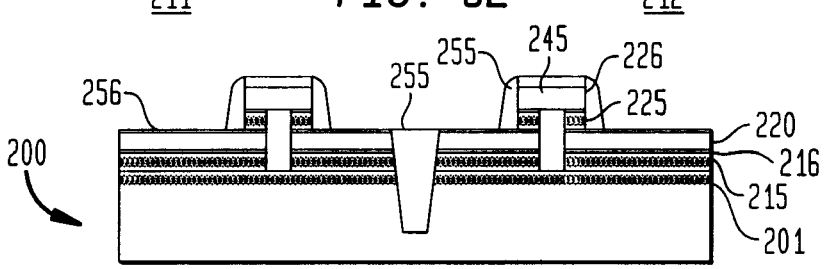
Figure 3F:
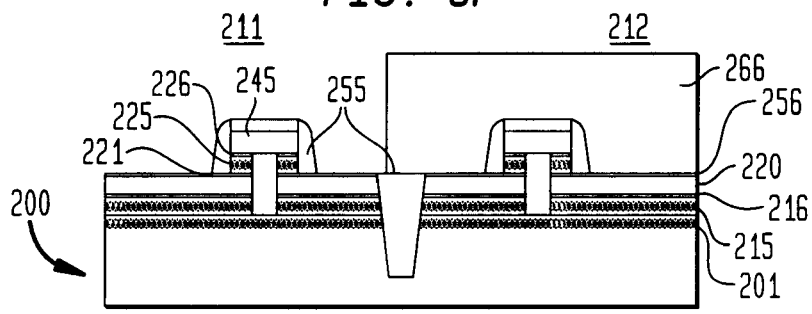
Figure 3G:
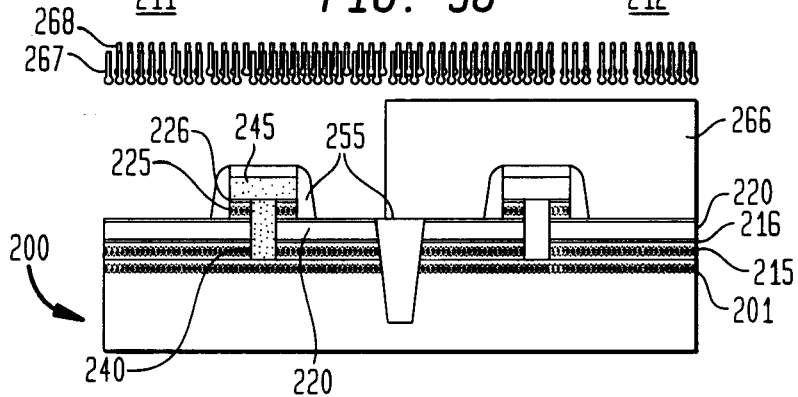
Figure 3R:
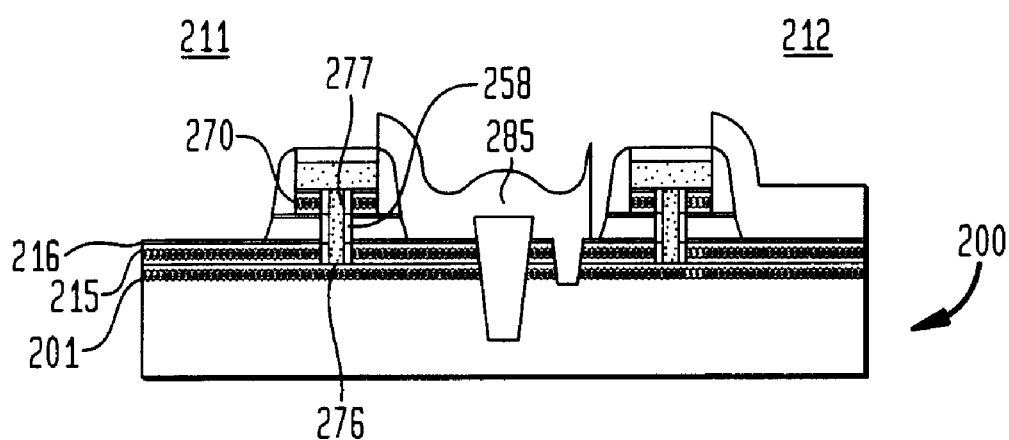

In the embodiment illustrated in FIGS. 3A–3R, layers of silicon dioxide 215, 220 and 225 are formed over the semiconductor substrate 200. Over each of layers 215, 220, and 225 is formed a thin layer of silicon nitride 216, 221 and 226, respectively. The composition, thickness and function of these layers is described in the previous exemplary process sequence.

N-type region 211 and p-type region 212 are formed by performing selective implants of n-type and p-type dopants into layers 215 and 225 and region 201 of substrate 200. The process sequence for forming the selective implants is as previously described. The substrate is then annealed to distribute the dopant in the desired manner. Silicon plugs 240 are formed in the n-type 211 and p-type 212 regions as previously described. Layers of polysilicon 245 and silicon nitride 250 are formed on the substrate, after which the substrate is selectively etched. The resulting structure is illustrated in FIG. 3A. The only difference between the structure depicted in FIG. 3A and the structure illustrated in FIG. 2K is that there is no trench isolation carried out in FIG. 3A.

Referring to FIG. 3B, an isolation region 251 is etched into the structure depicted in FIG. 3A. The isolation region electrically isolates the n-type device region 211 from the p-type device region 212. The isolation region 251 also separates the p-type region of layers 215, 216, 220, 221, 225 and 226 from the n-type region. This provides for subsequent selective removal of sacrificial layer 220. A layer of silicon nitride 255 (FIG. 3C) is then formed over the entire structure. The purpose of this trench is therefore two-fold. The trench electrically isolates the n-type region 211 from the p-type region 212. The trench also acts to isolate the portion of the layers 215, 216, 220, 221, 225 and 226 on one side of the trench from etch expedients used to remove one or more of these layers on the other side of the trench. In the illustrated embodiment, both functions are performed by a single trench. However, this is not a requirement. In alternative embodiments, these functions can be performed by separate trenches or other isolation expedients. For example, in an alternate embodiment the trench isolation can be carried out early on in the process (as shown in FIGS. 2A–2K) and the etch isolation trench can be formed later in the process.

Referring to FIG. 3D, the structure depicted in FIG. 3C is subjected to an anisotropic dry etch. The etch expedient is conventional and suitable etch expedients are well known to one skilled in the art. Portions of the silicon nitride layers 255, 250 and 221 are removed by etching. It is advantageous, but not required, if the etchant is selective (i.e., it removes silicon nitride at a faster rate than it removes the underlying silicon oxide layer 220). All of layer 255 is subsequently removed except side spacers adjacent to layers 221, 225, 226, 245 and 250 and the portion in trench 251. The silicon nitride-filled isolation trench 251 electrically isolates the n-MOS devices subsequently formed in region 211 from the p-MOS devices subsequently formed in region 212.

A thin layer of amorphous silicon 256 is formed over the structure as depicted in FIG. 3D. The resulting structure is illustrated in FIG. 3E. This layer will protect region 212 from the subsequent selective processing of region 211. Consequently layer 256 is sufficiently thick to act as an etch stop for the expedients used to remove layer 220 in region 211. A suitable thickness is about 10 nm to about 50 nm.

Referring to FIG. 3F, region 212 is masked with photolithographically defined mask 266. The thin layer of amorphous silicon 256 is then removed from the surface of region 211 selectively with respect to layers 220, 250 and 255. As illustrated in FIG. 3G, two implants are then performed in region 211. P-type dopant 267 is implanted into the silicon plug 240 to form the channel of the devices in region 211. Polycrystalline silicon layer 245 is also doped by implantation (with n-type dopant 268) to form the device drain. As a result of these implants, dopant of both types is present in layer 220. In an alternate embodiment, the silicon plug can be doped selectively immediately after it is formed and the substrate is planarized by CMP.

Referring to FIG. 3H, the substrate is then subjected to a wet etch or isotropic dry etch expedient. The etch expedient is selected to remove sacrificial layer 220 in the n-type region 211. The portion of the sacrificial layer 220 in the p-type region is not removed because the layer of amorphous silicon is still present over layer 220 in the p-type region 212. The etch rate of layer 220 in this expedient is significantly faster than the etch rate of layers 221, 216, 240, 250, 255 and 256. As illustrated in FIG. 3H, due to the etch selectivity in the wet etch expedient, the sacrificial layer 220 is completely removed. Layers 216 and 221 confine the etch to the removal of sacrificial layer 220. As a result of this etch, the portion of the silicon plug 240 that corresponds to the deposited thickness of layer 220 is exposed. The exposed surface 257 of the plug 240 will be the physical gate length of the device being formed.

Optionally, the structure depicted in FIG. 3H is then heated in an oxygen-containing atmosphere to grow a layer of thermal oxide (not shown) on the exposed surface 257 of the crystal silicon plug 240. The thin layer of sacrificial thermal oxide is removed using conventional expedients such as a wet etch (e.g., aqueous hydrofluoric acid). As a result of the formation and removal of the sacrificial thermal oxide, the surface of the silicon plug 240 is smoother and some of the sidewall defects and etch damage are removed. The particular conditions used to form and remove the sacrificial oxide are optionally selected to tailor the width of the silicon plug to a desired dimension.

After the thin layer of thermal oxide is removed, a layer of gate dielectric (e.g. silicon dioxide, silicon oxynitride, silicon nitride or metal oxide) 258 (FIG. 3I) is formed on the silicon plug 240. The thickness of the gate dielectric is about 1 nm to about 20 nm. In one embodiment, the silicon dioxide layer is formed by heating the substrate to a temperature in the range of about 700° C. to about 1100° C. in an oxygen-containing atmosphere. Other expedients for forming the gate dielectric, such as chemical vapor deposition, jet vapor deposition, and atomic layer deposition, are also contemplated as suitable. Conditions for forming a gate dielectric of the desired thickness are well known to one skilled in the art. A conformal layer of in-situ n-doped polycrystalline silicon 270 (or another suitable, conformal, conductive layer) is then formed over the entire substrate. Layer 270 is the gate material for the n-MOS devices. The use of n-doped polycrystalline silicon in this embodiment is merely illustrative.

The structure depicted in FIG. 3I is then subjected to a selective anisotropic dry etch. The resulting structure, wherein the remaining portion of the n-doped polycrystalline layer 270 surrounds the silicon plug 240, is illustrated in FIG. 3J. The thin layer of amorphous silicon 256 (FIG. 3I) is also removed from the surface of region 212 during this etch. Depending upon the gate dielectric material, a multiple etch sequence may be required. For example, when the gate dielectric is formed by thermal oxidation, an aqueous HF etchant is first used to remove the silicon dioxide that formed on layer 256 in region 212, prior to the removal of amorphous silicon layer 256.

Referring to FIG. 3K, region 211 is masked with photolithographically defined resist mask 271. The process sequence for region 211 is then substantially repeated for unmasked region 212 (the only differences resulting from the fact that p-MOS devices are formed in region 212 while n-MOS devices are formed in region 211). Specifically, as illustrated in FIG. 3K two implants are then performed in region 212. N-type dopant 272 is implanted into the silicon plug 240 to form the channel of the devices in region 212. The polycrystalline silicon layer 145 is also doped by implantation (with p-type dopant 273) to form the device drain. Dopant of both types are implanted into layer 220. As noted earlier, in an alternate embodiment the silicon plug can be doped selectively immediately after it is formed and the substrate is planarized by CMP.

Referring to FIG. 3L, the substrate is then subjected to a wet etch or isotropic dry etch expedient after the resist mask is removed. The etch expedient is selected to remove sacrificial layer 220 in the p-type region 212. The etch rate of layer 220 in this expedient is significantly faster than the etch rate of layers 270, 255, 250, 240, 221 and 216. As illustrated in FIG. 3L, the sacrificial layer 220 is completely removed due to the etch selectivity in the wet etch expedient. Layers 216 and 221 confine the etch to the removal of sacrificial layer 220. As a result of this etch, the portion of the silicon plug 240 that corresponds to the thickness of layer 220 is exposed. The exposed surface 257 of the plug 240 will be the physical gate length of the device being formed.

The structure depicted in FIG. 3L is then optionally heated in an oxygen-containing atmosphere to grow a layer of thermal oxide (not shown) on the exposed surface 257 of the crystal silicon plug 240 as previously described in the process sequence for region 211. This optional sacrificial oxide is then removed with a suitable etch expedient (e.g. aqueous HF). Referring to FIG. 3M, the gate dielectric 258 is formed on the silicon plug 240 in the previously described manner for the devices in region 211. The gate dielectric for the p-type devices is not formed at the same time as the gate dielectric for the n-type devices. Consequently, the gate dielectric for the n-type devices and the p-type devices is either the same or different. This provides for greater flexibility in device design. A conformal layer of in-situ p-doped polycrystalline silicon 275 (or another suitable, conformal, conductive layer) is then formed over the entire substrate. Layer 275 is the gate material for the p-MOS devices. The use of p-doped polycrystalline silicon in this embodiment is merely illustrative.

The structure depicted in FIG. 3M is then subjected to a selective anisotropic dry etch. Suitable etch expedients are conventional and well known to one skilled in the art. The resulting structure, wherein the remaining portion of the p-doped polycrystalline layer 275 surrounds the silicon plug 240, is illustrated in FIG. 3N.

The structure depicted in FIG. 3N is then subjected to a thermal driving force that is sufficient to cause dopants to diffuse from layers 215 and 225 into the adjacent silicon plug 240. Dopants of one type (i.e. n-type in region 211 or p-type in region 212) are introduced into the silicon plug 240 to form the source and drain extensions, 276 and 277, respectively. This is illustrated in FIG. 3O. The placement of this step in this processing sequence is merely illustrative. As one skilled in the art is aware, this solid phase diffusion step can be performed at a variety of points in the process sequence.

Once the silicon plug 240 is doped and the dopant is distributed in the plug 240 in the desired manner, the substrate is not subjected to conditions that significantly affect the distribution of the dopant in the silicon plug 240. Consequently, after this step, the substrate is not exposed to temperatures that exceed 1100° C. It is advantageous if the substrate is not exposed to temperatures in excess of 1000° C. after this point in the process. In certain embodiments, the substrate is not exposed to temperatures that exceed 900° C. after this point in the process for prolonged periods of time (e.g. in excess of several minutes). However, the substrate can be subjected to a rapid thermal anneal at temperatures of up to about 1050° C. without adversely affecting the distribution of the dopant in the silicon plug 240.

The following sequence illustrates how the devices formed in regions 211 and 212 are interconnected. This sequence is by way of example only. One skilled in the art is well aware of numerous, equally suitable interconnect strategies for CMOS integrated circuits. Referring to FIG. 3P, a window 280 is etched through layers 216 and 215 in the p-MOS region 212. The window 280 terminates at the surface of the semiconductor substrate 200. A layer of metal 285 is formed over the entire surface of the structure illustrated in FIG. 3P. The resulting structure is illustrated in FIG. 3Q. The metal is then patterned using conventional lithographic techniques to form two types of interconnects. One type of interconnect is between a gate of a device and the substrate 200 and is completely shown in FIG. 3R. The other type of interconnect is a strap between the gate 275 of the device in the p-MOS region 212 and the gate of another n-MOS device (not shown). The strap interconnect permits the formation of a very low electrical resistance connection between the dual polycrystalline silicon gate electrodes.

After these interconnects are formed, a planar layer of dielectric material is formed over the structure in the manner previously described. Windows are formed in this dielectric layer and the windows are filled with metal to form the desired interconnects.

The process of the present invention is useful to obtain a CMOS integrated circuit in which the device design is tailored to obtain advantageous device performance. For example, previously described layers 216 and 221 also function as offset spacers. The thicknesses of the offset spacers are determined by the thicknesses of deposited layers 216 and 221. In the context of the present invention, an offset spacer controls the position of the junction between the source and drain extensions and the channel relative to the gate of the device. Specifically, the presence of the offset spacer prevents the source/drain extensions from extending as far under the gate as they would otherwise extend if the offset spacers were not present. One skilled in the art is aware that, the further that the source/drain extensions extend under the gate, the greater the adverse consequences on device performance (i.e., gate/source and gate/drain overlap capacitances are increased). One skilled in the art will appreciate that the offset spacers cannot be so thick as to provide a series resistance between the source/drain extension and the inversion layer under the gate that would provide unacceptable device performance. Layer 216 performs this offset spacer function by its presence between layers 215 and layer 220 and when adjacent layer 215 is a source for dopants.

Similarly layer 221 performs this offset spacer function by its presence between layers 220 and layer 225 and when adjacent layer 225 is a source for dopants. However, the thickness of layer 216 is not required to be the same as the thickness of layer 221. Therefore, the thickness of the offset spacer can be independently chosen for layers 216 and 221 to achieve the desired balance between overlap capacitance (which favors a thicker offset spacer) and low series resistance (which favors a thinner offset spacer). For a given vertical distance moved by the dopants from the dopant source layers 215 and 225, the amount of overlap between the source/drain extensions and the gate can be controlled precisely through the thicknesses of layers 216 and 221.

In one embodiment of the present invention, layer 220 is also a silicon oxide that is selectively doped by ion implantation. Typically, the type of dopant (i.e. n-type or p-type) is opposite the type used to form the device source and drain regions. For example, if the source and drain regions are n-type (i.e. doped with arsenic or phosphorus) then the dopant in layer 225 is p-type (e.g. boron). One example of a suitable doped oxide is borosilicate glass (BSG). However, in certain embodiments it may be desired to use layer 220 as a source for introducing compensating dopant into a channel that is already uniformly doped with the opposite type (referred to as a retrograde dopant profile). Also, a dopant concentration gradient can be introduced into layer 220 to effect a desired dopant concentration gradient (i.e. the vertical doping profile) in the device channel. One skilled in the art is capable of providing a dopant source layer with the desired dopant type and concentration to achieve the desired effect.

As previously noted, layers 215 and 225 can be a self-aligned dopant source for the source and drain extensions. Similarly, layer 220 can be a self-aligned dopant source for the channel. The concentration gradient of the dopant in the dopant source layers can be controlled in order to introduce a corresponding vertical dopant gradient in the respective source/drain extensions or channel region of the plug 240.

In alternate embodiments, the sacrificial oxide is also used to provide increased resistance to short channel effects while maintaining a suitable low sheet resistance in the source/drain extensions. Short channel effects such as drain-induced barrier lowering, threshold voltage rolloff and degradation of the sub-threshold swing generally cause an increase in the device off-current. Such increases in device off-current are not desired. Increased resistance to short-channel effects is accomplished by forming a thicker sacrificial oxide. Since the sacrificial oxide is removed, the thicker the sacrificial oxide, the more recessed the surface of the channel region of the device will be in the silicon plug 240, relative to the surface of the source 276 and drain 277 extensions formed in the silicon plug. Consequently, the depth of the source 276 and 277 extensions from the perspective of the channel surface in the silicon plug is shallower than the depth of the source and drain extensions from the perspective of the surface of the source and drain extensions. One skilled in the art is well aware that reducing the depth of the source 276 and drain 277 extensions from the perspective of the channel surface makes the device more resistant to short channel effects. By using the sacrificial oxide to recess the channel surface with respect to the source and drain extensions, a transistor device with elevated source and drain extensions is formed.

The particular thickness of the sacrificial oxide will depend upon the depth of the source and drain extensions for a particular device. For example, if the depth of the source and drain extensions of a device is 30 nm, then one might grow a sacrificial oxide with a thickness of 50 nm. When the sacrificial oxide is removed, the channel of such a device will be recessed about 22 nm below the surface of the source and drain extensions. In this example, the depth of the source/drain extensions with respect to the channel surface is about 8 nm.

A description of how to scale the depth of the source/drain extensions as viewed from the channel and therefore how to select a sacrificial oxide thickness in order to obtain a desired device effect is described in Brews, J. R., et al., "Generalized Guide for MOSFET Miniaturization," *IEDM*, p. 215 (1979), which is incorporated by reference herein. One skilled in the art is able to select conditions in order to obtain a desired thickness of the sacrificial oxide.

In the process of the present invention, there is an upper limit to the thickness of the sacrificial oxide that can form on the silicon plugs in certain configurations. This upper limit depends upon the oxidation conditions. Once that thickness is reached, the oxide will get no thicker under these conditions. This process is advantageous because it is self-limiting. Consequently, one need not monitor the thickness of the oxide to determine endpoint. One can form very thin (less than 50 nm) uniform plugs in this way.

In the embodiments of the present invention where a thick (i.e. greater than 10 nm thick) sacrificial oxide is formed, the thickness of the nitride layers 216 and 221 are selected to ensure that they act as etch stops to protect layers 215 and 225 during the removal of this thick, sacrificial oxide. Layers 216 and 221 must also be thick enough to mechanically withstand the stresses introduced when the thick sacrificial oxide is formed. Nitride layers having a thickness of at least one-third the oxide thickness are contemplated as suitable. Nitride layers having a thickness of at least one-half the oxide thickness can withstand more mechanical stress than thinner layers.

The embodiments described above are provided to illustrate specific examples of processes that utilize the present invention. One skilled in the art will appreciate that there are many process sequences, materials, and expedients that are useful for practicing the present invention. Also, the process sequence is illustrative. The steps in the process are not required to be performed in a particular order. The present invention is not to be construed as limited to the illustrative embodiments, except as is consistent with the appended claims.

What is claimed is:

1. A process for fabricating a vertical transistor CMOS integrated circuit comprising:

forming at least three layers of material over a semiconductor substrate wherein the second layer is interposed between the first and the third layers;

selectively forming an n-type region and a p-type region in the semiconductor substrate with the at least three layers of material formed thereon wherein a first device region selected from the group consisting of a source region and a drain region of a semiconductor device is formed in the semiconductor substrate;

forming a window in both the n-type region and the p-type region of the at least three layers of material, wherein the window terminates at the first device region formed in the semiconductor substrate;

filling the windows with a semiconductor material thereby forming semiconductor plugs in the at least three layers of material, wherein the plugs have a first end and a second end and wherein the first end is in contact with the first device region;

forming a second device region selected from the group consisting of a source region and a drain region in the second end of the silicon plug, wherein one of the first and second device regions is a source region and the other is a drain region;

removing a portion of the third layer, thereby exposing the second layer underlying the removed portion of the third layer;

removing the second layer, thereby exposing a portion of the semiconductor plug;

forming a layer of dielectric material on the exposed portion of the semiconductor plug;

forming a gate in contact with the layer of dielectric material.

2. The process of claim 1 wherein the second layer is removed by etching in an etchant, wherein the first layer has a first etch rate, the second layer has a second etch rate, and the third layer has a third etch rate in an etchant, and wherein the second etch rate is at least ten times faster than the first etch rate and the third etch rate in the etchant.

3. The process of claim 2 wherein the etchant is selected from the group consisting of isotropic wet etch etchants and isotropic dry etch etchants.

4. The process of claim 1 further comprising electrically isolating the n-MOS region from the p-MOS region.

5. The process of claim 4 wherein the n-MOS region is electrically isolated from the p-MOS region by forming a trench in the substrate and filling the trench with a dielectric material.

6. The process of claim 5 wherein the trench is formed after the at least three layers of material are formed on the substrate.

7. The process of claim 1 wherein the semiconductor plug material is a crystalline semiconductor material and is selected from the group consisting of silicon, silicon-germanium, and silicon-germanium-carbon.

8. The process of claim 7 wherein the semiconductor plug is doped by implanting dopant into the semiconductor material after it is deposited in the window.

9. The process of claim 1 further comprising forming an insulating layer over at least one of the first layer of material, the second layer of material or the third layer of material.

10. The process of claim 9 wherein the layer of insulating material is an etch stop material.

11. The process of claim 9 wherein the insulating layer formed over one or both of the first layer of material and the second layer of material is an offset spacer.

12. The process of claim 1 wherein the n-type region and the p-type region are formed by forming a mask on one of either the p-type region or the n-type region and implanting dopant into the other of the p-type or n-type region and wherein n-type dopant is implanted in the n-type region and p-type dopant is implanted in the p-type region.

13. The process of claim 12 further comprising selectively implanting dopant in the substrate to form the n-type region and the p-type region in the substrate before the at least three layers of material are formed on the substrate.

14. The process of claim 12 further comprising selectively implanting dopant in the first material layer to form the n-type region and the p-type region in the first material layer before the second material layer is formed thereon.

15. The process of claim 14 further comprising selectively implanting dopant in the second material layer to form the n-type region and the p-type region in the second material layer before the third material layer is formed thereon.

16. The process of claim 12 wherein the substrate with the at least three layers of material formed thereon is selectively implanted with dopant to form the n-type region and the p-type region.

17. The process of claim 1 wherein the third material layer is a chemical mechanical polishing stop layer.

18. The process of claim 12 wherein the dopant is implanted at a depth and in a concentration selected to provide a dopant concentration of at least about $1 \times 10^{20}$ atoms/cm$^3$ in the first and third material layers formed on the substrate.

19. The process of claim 9 wherein the insulating layer formed over the third material layer is a chemical mechanical stop layer and the windows are filled with a semiconductor material by epitaxially growing the semiconductor material in the window.

20. The process of claim 19 further comprising chemical mechanical polishing the surface of the substrate with the at least three material layers formed thereon after the windows are filled with the semiconductor material.

21. The process of claim 12 wherein the second device region is formed by depositing a device layer onto the substrate with the at least three layers of material formed thereon, patterning the device layer so that the remaining portion of the device layer is the portion overlying the semiconductor plug and implanting dopant into the patterned device layer.

22. The process of claim 1 wherein the second layer from one of either the n-type region or the p-type region is removed without removing the second layer from the other of either the n-type region or the p-type region.

23. The process of claim 22 further comprising forming a trench in the second layer and filling the trench with an etchant isolation material before the second layer from either the n-type region or the p-type region is removed.

24. The process of claim 23 further comprising masking one of either the n-type region or the p-type region before the second layer in the other of the n-type region or the p-type region is removed.

25. The process of claim 24 wherein the mask is selected from the group consisting of amorphous silicon or polycrystalline silicon.

26. The process of claim 21 further comprising masking the p-type region so that the p-type region is masked when dopant is implanted into the patterned device layer in the n-type region and masking the n-type region so that the n-type region is masked when dopant is implanted into the patterned device layer in the p-type region.

27. The process of claim 26 wherein the layer of dielectric material is formed on the semiconductor plug in one of either the n-type region or the p-type region when the other of the n-type region or the p-type region is masked.

28. The process of claim 26 wherein the gate is formed on the semiconductor plug in one of either the n-type region or the p-type region when the other of the n-type region or the p-type region is masked.

29. The process of claim 1 wherein the gate is at least one layer of material selected from the group consisting of polycrystalline silicon, amorphous silicon, silicon-germanium, silicon-germanium-carbon, metals, and metal compounds.

30. The process of claim 29 further comprising forming an electrical contact between at least one gate in either the n-type or p-type region with the substrate in either the n-type region or the p-type region.

31. The process of claim 29 wherein the metals and metal compounds are selected from the group consisting of titanium, titanium nitride, tungsten, tungsten silicide, tantalum, tantalum nitride, molybdenum, copper and aluminum.

32. The process of claim 29 further comprising forming an electrical contact between at least one gate in the n-type region to at least one gate in the p-type region.

33. The process of claim 32 wherein the electrical contact is a metal or a metal compound.

34. The process of claim 33 wherein the metal or metal compound is selected from the group consisting of titanium, titanium nitride, tungsten, tungsten silicide, tantalum, tantalum nitride, molybdenum, copper and aluminum.

* * * * *